United States Patent
Jeon et al.

(10) Patent No.: US 6,586,349 B1
(45) Date of Patent: Jul. 1, 2003

(54) INTEGRATED PROCESS FOR FABRICATION OF GRADED COMPOSITE DIELECTRIC MATERIAL LAYERS FOR SEMICONDUCTOR DEVICES

(75) Inventors: Joong S. Jeon, Cupertino, CA (US); Arvind Halliyal, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/081,112

(22) Filed: Feb. 21, 2002

(51) Int. Cl.$^7$ .............................................. H01L 21/31
(52) U.S. Cl. ....................... 438/785; 438/685; 438/778; 427/585
(58) Field of Search ................................ 438/785, 758, 438/778, 685; 427/585

(56) References Cited

U.S. PATENT DOCUMENTS

| | | | |
|---|---|---|---|
| 5,015,502 A | 5/1991 | Strangman et al. | 427/248.1 |
| 5,120,672 A | 6/1992 | Mitchell et al. | 437/43 |
| 5,648,113 A | 7/1997 | Barbee et al. | 427/8 |
| 5,654,035 A | 8/1997 | Ljungberg et al. | 427/255.3 |
| 6,008,091 A | 12/1999 | Gregor et al. | 438/261 |
| 6,037,003 A | 3/2000 | Gordon et al. | 427/255.34 |
| 6,171,900 B1 | 1/2001 | Sun | 438/240 |
| 6,278,166 B1 | 8/2001 | Ogle, Jr. | 257/411 |
| 6,309,927 B1 | 10/2001 | Au et al. | 438/261 |
| 6,319,730 B1 | 11/2001 | Ramdani et al. | 438/3 |
| 6,337,289 B1 * | 1/2002 | Narwankar et al. | 438/776 |
| 6,395,644 B1 * | 5/2002 | Hopper et al. | 438/738 |
| 6,406,960 B1 | 6/2002 | Hopper et al. | 438/261 |
| 6,407,435 B1 | 6/2002 | Ma et al. | 257/411 |
| 6,420,279 B1 | 7/2002 | Ono et al. | 438/785 |
| 6,438,030 B1 | 8/2002 | Hu et al. | 365/185.18 |
| 6,461,905 B1 | 10/2002 | Wang et al. | 438/183 |
| 2002/0190311 A1 | 12/2002 | Blomme et al. | 257/321 |

OTHER PUBLICATIONS

Kukli et al.; "Tailoring the Dielectric Properties of HfO$_2$—Ta$_2$O$_5$ Nanolaminates"; Appl. Phys. Lett., vol. 68 No. 26, Jun. 24, 1996.

Zhang et al.; "High Permittivity Thin Film Nanolaminates"; Journal of Applied Physics; vol. 87, No. 4, Feb. 15, 2000.

* cited by examiner

Primary Examiner—Alexander Ghyka
(74) Attorney, Agent, or Firm—Renner, Otto, Boisselle & Sklar, LLP

(57) ABSTRACT

The present invention relates to a method for fabricating a semiconductor device, and to a semiconductor device, the method including providing a semiconductor substrate; depositing on the semiconductor substrate a composite dielectric material layer including elements of at least two dielectric materials, in which the step of depositing includes providing a first precursor for a first dielectric material at a first rate and providing a second precursor for a second dielectric material at a second rate, in which at least a portion of the at least two dielectric materials are deposited simultaneously. The semiconductor device includes a composite dielectric material layer having a thickness, and including elements of a first dielectric material and a second dielectric material, in which the composite dielectric material layer includes a varying concentration ratio of the first dielectric material to the second dielectric material through the thickness.

19 Claims, 3 Drawing Sheets

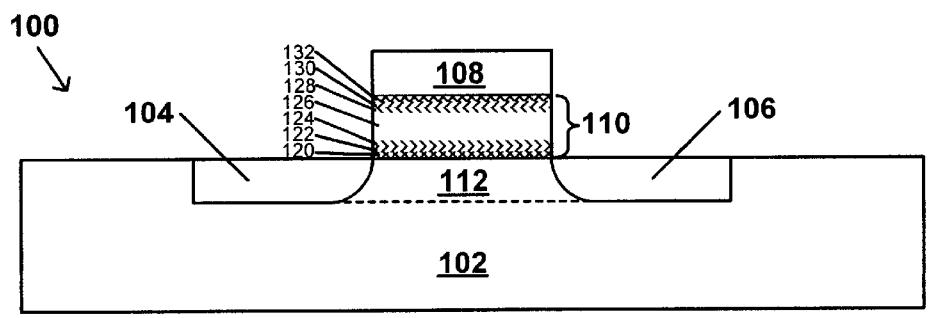
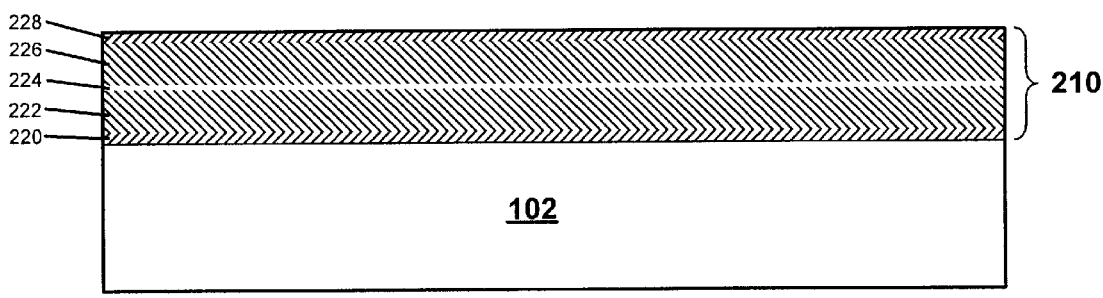
Fig. 1
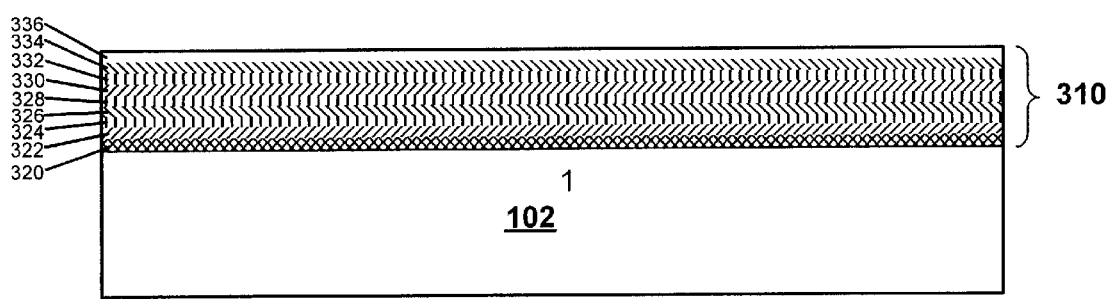
Fig. 2
Fig. 3

US 6,586,349 B1

INTEGRATED PROCESS FOR FABRICATION OF GRADED COMPOSITE DIELECTRIC MATERIAL LAYERS FOR SEMICONDUCTOR DEVICES

FIELD OF THE INVENTION

The invention relates generally to the fabrication of semiconductor devices and, more particularly, to the fabrication of composite dielectric material layers in semiconductor devices.

BACKGROUND OF THE INVENTION

Fabrication of semiconductor devices, such as a metal-oxide-semiconductor (MOS) integrated circuit, involves numerous processing steps. In a semiconductor device, a gate dielectric, typically formed from silicon dioxide ("oxide"), is formed on a semiconductor substrate which is doped with either n-type or p-type impurities. For each MOS field effect transistor (MOSFET) being formed, a gate conductor is formed over the gate dielectric, and dopant impurities are introduced into the substrate to form a source and drain. A pervasive trend in modern integrated circuit manufacture is to produce transistors having feature sizes as small as possible. Many present processes employ features, such as gate conductors and interconnects, which have less than 0.18 $\mu$m critical dimension. As feature sizes continue to decrease, the size of the resulting transistor as well as the interconnect between transistors also decreases. Fabrication of smaller transistors allows more transistors to be placed on a single die, thereby allowing relatively large circuit systems to be incorporated on a single, relatively small die area.

As MOSFET feature sizes decrease, gate oxide thickness decreases as well. This decrease in gate oxide thickness is driven in part by the demands of overall device scaling. As gate conductor widths decrease, for example, other device dimensions must also decrease in order to maintain proper device operation. Early MOSFET scaling techniques involved decreasing all dimensions and voltages by a constant scaling factor, to maintain constant electric fields in the device as the feature size decreased. This approach has given way to more flexible scaling guidelines which account for operating characteristics of short-channel devices. For example, a maximum value of MOSFET subthreshold current can be maintained while feature sizes shrink, by decreasing any or all of several quantities, including gate oxide thickness, operating voltage, depletion width, and junction depth, by appropriate amounts.

As a result of the continuing decrease in feature size, gate oxide thickness has been reduced so much that oxides are approaching thicknesses below ten angstroms (Å). Unfortunately, thin oxide films may break down when subjected to an electric field, particularly for gate oxides less than 20 Å thick. It is probable that even for a relatively low gate voltage of 3V, electrons can pass through such a thin gate oxide by a quantum mechanical tunneling effect. In this manner, a tunneling current may undesirably form between the semiconductor substrate and the gate conductor, adversely affecting the operability of the device. It is postulated that some of these electrons may become entrapped within the gate oxide by, e.g., dangling bonds. As a result, a net negative charge density may form in the gate oxide. As the trapped charge accumulates with time, the threshold voltage $V_T$ may shift from its design specification. Breakdown of the gate oxide may also occur at even lower values of gate voltage, as a result of defects in the gate oxide. Such defects are unfortunately more pronounced in relatively thin gate oxides, since any given defect is more likely to have an adverse effect on the function of the gate oxide. For example, a thin gate oxide may contain pinholes and/or localized voids due to unevenness at which the oxide grows on a less than perfect silicon lattice. Such unevenness is tolerable at greater thicknesses, but is less so in very thin gate oxides.

A more promising approach to solve the problem of thin gate oxides is to increase the permittivity of the gate dielectric. Permittivity, $\in$, of a material reflects the ability of the material to be polarized by an electric field. The permittivity of a material is typically described as its permittivity normalized to the permittivity of a vacuum, $\in_0$. Hence, the relative permittivity, referred to as the dielectric constant, of a material is defined as:

$$K=\in/\in_0$$

While silicon dioxide (sometimes simply referred to as "oxide") has a dielectric constant of approximately 4, other dielectric materials have higher K values. Silicon nitride ("nitride"), for example, has a K of about 6 to 9 (depending on formation conditions). Much higher K values of, for example, 20 or more can be obtained with various transition metal oxides including hafnium oxide ($HfO_2$), zirconium oxide, ($ZrO_2$), tantalum oxide ($Ta_2O_5$), barium strontium titanate ("BST"), lead zirconate titanate ("PZT"), and others described more fully below. Using a high-K dielectric material for a gate dielectric would allow a low electrical thickness gate oxide thickness to be achieved even with a physically thick dielectric layer. For example, a high-K gate dielectric with a K of 40 and a thickness of 100 angstroms is substantially electrically equivalent to a silicon dioxide gate dielectric (K about 4) having a thickness of about 10 angstroms. The electrically equivalent thickness of high-K materials may be referred to in terms of the equivalent oxide thickness. Thus, the high-K gate dielectric having a K value of 40 and a given physical thickness has an equivalent oxide thickness which is approximately 1/10 the given physical thickness. For higher-K dielectric materials, thicker gate dielectric layers can be formed while maintaining equivalent oxide thickness values lower than are possible with very thin oxide layers. In this way, the reliability problems associated with very thin dielectric layers may be avoided while transistor performance is increased.

One problem which has been reported relating to integration of high-K dielectric materials is unwanted oxidation of silicon by high-K dielectric materials when the high-K dielectric material is formed directly on a silicon substrate. Additionally, in fabricating semiconductor devices having a plurality of layers of dielectric material, a number of steps are typically necessary for changing from deposition of one dielectric material to another in forming successive layers of the plurality of layers. Each of these steps may be accompanied by a heat/cool cycle. Typically, the heat/cool cycles account for as much as 70% of the time required for fabrication of such layers.

Thus, a method of forming a dielectric material, which either overcomes or takes advantage of such reactions, or both, and which provides a simple, efficient fabrication of a high-K dielectric material with a minimum number of discrete steps and with a minimum of production time is needed.

SUMMARY OF THE INVENTION

The present invention relates to a method of fabricating a semiconductor device, comprising providing a semiconductor substrate; and depositing on the semiconductor substrate a composite dielectric material layer comprising elements of at least two dielectric materials, in which the step of depositing comprises providing a first precursor for a first dielectric material at a first rate and providing a second precursor for a second dielectric material at a second rate.

In one embodiment, the present invention relates to a method of fabricating a semiconductor device, including providing a semiconductor substrate; and depositing by CVD over the semiconductor substrate a composite dielectric material layer including elements of at least one high-K dielectric material and at least one standard-K dielectric material, in which the step of depositing comprises providing a high-K precursor at a first rate and a standard-K precursor at a second rate and varying at least one of the first rate or the second rate, in which at least a portion of the at least two dielectric materials are deposited simultaneously. As a result of the deposition process, the composite dielectric material layer includes a concentration gradient of the first dielectric material relative to the second dielectric material in a thickness direction of the composite dielectric material layer.

The present invention further relates to a semiconductor device, comprising a semiconductor substrate; and a composite dielectric material layer having a thickness, the composite dielectric material layer comprising elements of a first dielectric material and a second dielectric material, wherein the composite dielectric material layer comprises a varying concentration ratio of the first dielectric material to the second dielectric material through the thickness.

The present invention provides a more efficient method of fabricating a composite dielectric layer, compared to a method in which discrete layers of a first dielectric material and a second dielectric material are deposited, followed by a step of annealing, in which at least a portion of the first and second dielectric materials combine to form a composite dielectric material layer. The present method is more efficient because the steps of depositing the first and second dielectric materials are carried out simultaneously, and no annealing step is needed. Such stepwise deposition of dielectric materials or dielectric precursor materials are disclosed in copending, commonly assigned U.S. patent application Ser. No. 09/977,922, filed Oct. 15, 2001, and U.S. patent application Ser. No. 09/977,928, filed Oct. 15, 2001, and U.S. patent application Ser. No. 10/051,790, (Express Mail No. EF297164362US, entitled PREPARATION OF COMPOSITE HIGH-K/STANDARD-K DIELECTRICS FOR SEMICONDUCTOR DEVICES), filed Jan. 17, 2002, the disclosures of which are hereby incorporated by reference for their teachings with respect to deposition of dielectric materials and precursors thereof. The methods disclosed in these applications include a step of annealing to form a composite dielectric material from stepwise, sequentially deposited sub-layers.

The present invention provides a solution to the problem of forming a high-K dielectric material which both overcomes and takes advantage of previously disfavored reactions between dielectric materials, which requires a minimum number of discrete steps, which avoids stopping and starting and changing from one apparatus or process to another, and which requires significantly less production time. The composite dielectric layer formed may include both a high-K dielectric material and a standard-K dielectric material simultaneously deposited. The method is simple and may be more efficiently carried out. By fabricating the dielectric material layers by simultaneous and continuous deposition of the sub-layers, the intervening heat/cool cycles are avoided. Thus, the present invention addresses and provides a solution for many of the problems of the prior art.

BRIEF DESCRIPTION OF THE DRAWINGS

FIG. 1 is a schematic cross-sectional view of a field effect transistor including an embodiment of a composite dielectric layer in accordance with the present invention.

FIGS. 2–6 are schematic cross-sectional views of a semiconductor substrates several alternate embodiments of a composite dielectric material layer, in accordance with the present invention.

DETAILED DESCRIPTION

Figure 4:
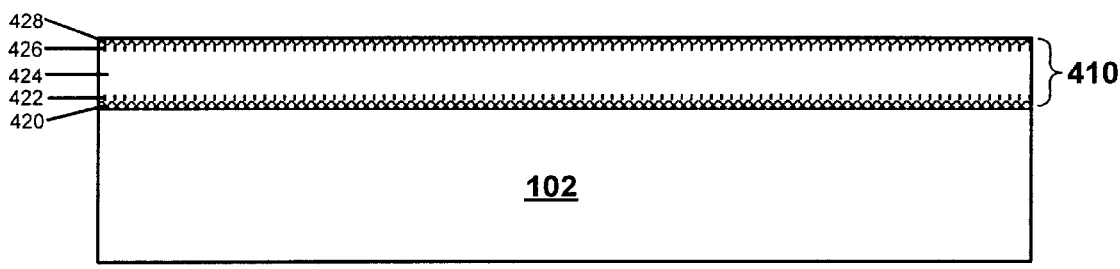

As used herein, the term "standard-K dielectric" refers to a dielectric material having a K up to about 10. Such standard-K dielectric materials include, for example, silicon dioxide, which has a K of about 4, silicon oxynitride, which has a K of about 4–8 depending on the relative content of oxygen and nitrogen, and silicon nitride, which has a K of about 6–9, and aluminum oxide, which has a K of about 10.

As used herein, the term "mid-K dielectric material" refers to a dielectric material having a K in the range from greater than 10 to about 20. Such mid-K dielectric materials include, for example, composite materials such as hafnium silicate, which has a K of about 14, and hafnium silicon oxynitride, which has a K of about 16, depending on the relative content of oxygen and nitrogen, and hafnium silicon nitride, which has a K of about 18.

As used herein, the term "high-K dielectric" refers to a dielectric material having a K of about 20 or more. Such high-K dielectric materials include, for example, $HfO_2$, $ZrO_2$, $CeO_2$ and others, some of which are identified more fully below. In general, the term "high-K dielectric material" encompasses binary, ternary and higher oxides and any ferroelectric material having a K of about 20 or more.

As used herein, the term "composite dielectric material" refers to a dielectric material which is formed of the elements of at least two different dielectric materials. The at least two different dielectric materials may comprise one or more of a standard-K dielectric material, a mid-K dielectric material or a high-K dielectric material. The composite dielectric material may have a K value ranging from that of a standard-K dielectric material to that of any of the high-K dielectric materials. The composite dielectric material may be formed by any appropriate process, for example, by co-deposition of the elements of the composite dielectric material.

Approximate K-values or, in some cases, a range of K-values, are shown below in Table 1 for several exemplary dielectric materials. It is understood that the present invention is not limited to the specific dielectric materials disclosed herein, but may include any appropriate standard-K and high-K dielectric materials which are known and are compatible with the remaining elements of the semiconductor device with which the dielectric materials are to be used.

TABLE 1

| Dielectric Material | Approximate Dielectric Constant (K) (Relative Permittivity) |
|---|---|
| silicon dioxide | 4 |
| silicon nitride | 6–9 |
| silicon oxynitride | 4–8 |
| aluminum oxide | 10 |
| zirconium silicate | 12 |
| hafnium silicate | 15 |
| lanthanum oxide, $La_2O_3$ | 20–30 |
| hafnium oxide, $HfO_2$ | 40 |
| zirconium oxide, $ZrO_2$ | 25 |
| cerium oxide, $CeO_2$ | 26 |
| bismuth silicon oxide, $Bi_4Si_2O_{12}$ | 35–75 |
| titanium dioxide, $TiO_2$ | 30 |
| tantalum oxide, $Ta_2O_5$ | 26 |
| tungsten oxide, $WO_3$ | 42 |
| yttrium oxide, $Y_2O_3$ | 20 |
| $LaAlO_3$ | 25 |
| BST ($Ba_{1-x}Sr_xTiO_3$) | ~20–~200 |
| $PbTiO_3$ | ~20–~200 |
| $BaTiO_3$ | ~20–~200 |
| $SiTiO_3$ | ~20–~200 |
| $PbZrO_3$ | ~20–~200 |
| PST ($PbSc_xTa_{1-x}O_3$) | ~200–~3000 |
| PZN ($PbZn_xNb_{1-x}O_3$) | ~200–~5000 |
| PZT ($PbZr_xTi_{1-x}O_3$) | ~100–~1000 |
| PMN ($PbMg_xNb_{1-x}O_3$) | ~200–~5000 |

It is noted that the K-values, or relative permittivity, for both standard-K and high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$. As used herein, the term "tantalum oxide" may include variants of stoichiometric $Ta_2O_5$, which may be referred to as $Ta_xO_y$, in which either of x or y vary by a small amount. For example, in one embodiment, x may vary from about 1.5 to 2.5, and y may vary from about 4.5 to about 5.5. In another embodiment, x may vary from about 1.75 to 2.25, and y may vary from about 4 to about 6. Such variations from the exact stoichiometric formula fall within the definition of tantalum oxide. Similar variations from exact stoichiometry are included when the chemical formula for a compound is used. For example, when the formula $Ta_2O_5$ is used, $Ta_xO_y$ as defined above is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Here and in all numerical values in the specification and claims, the limits of the ranges and ratios may be combined.

As used herein, the term "anneal" or "annealing" refers to a step or process in which a material is exposed to an elevated temperature for a time. The annealing may be a discrete step of annealing, such as a RTA, or it may be part of another step, such as a CVD, which is carried out at an elevated temperature. In either case, annealing includes exposure to an elevated temperature, and may include appropriate additional conditions, such as a selected atmosphere and pressure, for a selected period of time.

Semiconductor Devices

The present invention is described hereinbelow in terms of a common semiconductor device, specifically, a metal oxide semiconductor field effect transistor (MOSFET) formed on a silicon substrate. An embodiment of the present invention in a MOSFET is shown in FIG. 1. The present invention is not limited to this illustrative embodiment, however, and may be applied to any semiconductor device in which a dielectric layer is needed, for example, as a gate dielectric in a FET, as a gate dielectric in a floating gate EEPROM flash memory device, in a SONOS-type flash memory device, such as the MIRRORBIT™ two-bit flash memory device available from Advanced Micro Devices, Sunnyvale, Calif. Thus, it is to be understood that the present invention is not limited to the specific illustrative embodiments described below. Not shown in FIG. 1 are additional parts of a working semiconductor device, such as electrical conductors, protective coatings and other parts of the structure which would be included in a complete, working semiconductor device. These additional parts are not necessary to the present invention, and for simplicity and brevity are neither shown nor described, but can be added as needed, as will be understood by those of skill in the art.

The present invention relates to a semiconductor device and to a method for fabricating the semiconductor device, in which the semiconductor device includes a composite dielectric material layer which has a thickness. The composite dielectric material layer includes elements of a first dielectric material and a second dielectric material. The composite dielectric material layer includes a concentration ratio of the first dielectric material to the second dielectric material which varies through the thickness, i.e., in the thickness direction of the composite dielectric material layer. In one embodiment, at least one of the first dielectric material and the second dielectric material includes a high-K dielectric material. In one embodiment, at least one of the first dielectric material and the second dielectric material includes a standard-K dielectric material. In one embodiment, the composite dielectric layer includes elements of both a high-K dielectric material and a standard-K dielectric material.

In one embodiment, the standard-K dielectric material is aluminum oxide, $Al_2O_3$. In one embodiment, the standard-K dielectric material comprises a silicon-containing standard-K dielectric material, i.e., one or more of silicon dioxide, silicon nitride and silicon oxynitride. In one embodiment, the standard-K dielectric material comprises both aluminum oxide and a silicon-containing standard-K dielectric material.

In one embodiment, the composite dielectric material comprises at least one of a metal silicate and a metal aluminate formed from elements of the first dielectric material and the second dielectric material. In one embodiment, in the at least one of a metal aluminate and a metal silicate, the metal comprises at least one high-K derived metal. In one embodiment, the composite dielectric layer comprises a mixed metal aluminate/silicate, in which the metal comprises at least one high-K derived metal.

In one embodiment, the varying concentration ratio comprises a sinusoidally varying concentration of at least one of the first dielectric material and the second dielectric material.

FIG. 1 is a schematic cross-sectional view of a MOSFET 100. The MOSFET 100 includes, for example, a p-doped silicon substrate 102, an n-doped source region 104, an n-doped drain region 106, a gate 108, a gate composite dielectric layer 110, and a channel region 112.

In one embodiment, the semiconductor substrate 102 is a bulk silicon substrate. In one embodiment, the semiconductor substrate 102 is a silicon-on-insulator semiconductor substrate. In another embodiment, the semiconductor substrate 102 is a p-doped or an n-doped silicon substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention is not limited to any particular type of semiconductor substrate.

An exemplary legend for the drawings in FIGS. 1–6 is shown above the semiconductor device 100 in FIG. 1. For exemplary purposes only, and not for any limitation of the invention, the legend shows relative amounts (parts per hundred or percent by weight) of the first dielectric material and the second dielectric material arranged with the left-slanted, right-slanted or vertical hatching, cross-hatching or no hatching used in the drawings to represent the relative content of the two dielectric materials. It is noted that the drawings show exemplary concentrations for only two dielectric materials. However, the scope of the invention is not so limited, since any number of dielectric materials may be simultaneously applied, at selected individual rates, in accordance with the present invention. The exemplary legend shows five different concentrations of a first dielectric material and a second dielectric material, i.e., 100/0, 75/25, 50/50, 25/75 and 0/100, from top to bottom. These relative amounts are merely exemplary, any relative amount of the two materials being within the scope of the invention.

The following descriptions of the composite dielectric material layers 110 in FIGS. 1–6 refer to a first dielectric material and a second dielectric material. It is to be understood that each of these dielectric materials may comprise elements of at least one of either a high-K dielectric material or a standard-K dielectric material.

The composite dielectric material layer 110 shown in FIG. 1 includes seven sub-layers, 120, 122, 124, 126, 128, 130 and 132. Although the seven sub-layers (or any number of sub-layers in other embodiments) are shown as distinct layers, in actuality the sub-layers of the composite dielectric material may not be so well defined. As described more fully below, the method of the present invention includes simultaneously applying a first dielectric material and a second dielectric material. In one embodiment, the rates of application of each dielectric material are varied during the deposition step. The variations in rate may be abrupt or may be gradual. As a result, the change in the relative concentrations, i.e., the ratio of concentration of each dielectric material, may be relatively well defined, or alternatively may be gradual and so not well defined. Thus, the change in composition from one sub-layer to the next sub-layer may be quite indistinct.

It should be further recognized that, when a composite dielectric material layer of a material such as zirconium silicate ($ZrSiO_4$) is formed by simultaneous deposition of the elements of this material, since deposition of the separate components would give rise to two different dielectric materials ($ZrO_2$ and $SiO_2$), such simultaneous deposition is considered to be deposition of a first dielectric precursor material and a second dielectric precursor material, even though a single dielectric material ($ZrSiO_4$) is formed. Thus, reference to deposition of elements of a first dielectric material and a second dielectric material includes both simultaneous and sequential deposition of the respective dielectric materials.

The composite dielectric material layer 110 illustrated in FIG. 1 includes a lowermost sub-layer 120 and an uppermost sub-layer 132 each of which contain zero parts of the first dielectric material and 100 parts of the second dielectric material, according to the legend. In one embodiment, the sub-layers 120 and 132 comprise a standard-K dielectric material, such as silicon dioxide. In such an embodiment, deposition of $SiO_2$ is begun first, prior to deposition of any high-K dielectric material. Such an embodiment might be selected in order to avoid the possible oxidation of the underlying semiconductor substrate which may occur as a result of a direct deposition of a high-K dielectric material on a silicon surface of the semiconductor substrate.

Moving upward in the composite dielectric material layer 110 of FIG. 1, a sub-layer 122 is shown which comprises 25 parts of the first dielectric material, and 75 parts of the second dielectric material. A similar sub-layer 130 is shown just below the uppermost sub-layer 132.

Again moving upward in the composite dielectric material layer 110 of FIG. 1, a sub-layer 124 is shown which comprises 75 parts of the first dielectric material, and 25 parts of the second dielectric material. A similar sub-layer 128 is shown in the second sub-layer below the uppermost sub-layer 132.

Again moving upward in the composite dielectric material layer 110 of FIG. 1, a center sub-layer 126 is shown which comprises 100 parts of the first dielectric material, and zero parts of the second dielectric material. In one embodiment, in which the second dielectric material is a high-K dielectric material, the center sub-layer 126 is a high-K dielectric material. This embodiment provides a relatively high K-value to the composite dielectric layer as a whole, due to the relatively greater thickness of this sub-layer in this embodiment.

Referring now to FIG. 2, there is shown an alternate embodiment of the composite dielectric material layer 210 in accordance with the present invention. The embodiment of the composite dielectric material layer 210 shown in FIG. 2 comprises five sub-layers 220, 222, 224, 226 and 228. Referring to the exemplary legend, the embodiment of FIG. 2 comprises a lowermost sub-layer 220 and an uppermost sub-layer 228, each comprising 25 parts of the first dielectric material, and 75 parts of the second dielectric material. In FIG. 2, the next two sub-layers 222 and 226 (moving toward the center of the layer 110 in FIG. 2) each comprise 75 parts of the first dielectric material, and 25 parts of the second dielectric material. In this embodiment, the sub-layers 222 and 226 are the thickest sub-layers. Finally, in FIG. 2, a relatively thin center sub-layer 224 comprises 100 parts of the first dielectric material, and zero parts of the second dielectric material.

The embodiments of FIGS. 1 and 2 provide examples of varying both the first rate and the second rate during the step of depositing the composite dielectric material layer, in which the composite dielectric material layers each are formed with a symmetrical distribution of sub-layers in the thickness direction of the layer.

Referring now to FIG. 3, there is shown another embodiment of the composite dielectric material layer 310 in accordance with the present invention. The embodiment of the composite dielectric material layer 310 shown in FIG. 3 comprises nine sub-layers 320, 322, 324, 326, 328, 330, 332, 334 and 336. Referring to the exemplary legend, the embodiment of FIG. 3 comprises a lowermost sub-layer 320 comprising zero parts of the first dielectric material, and 100 parts of the second dielectric material. In FIG. 3, the second and sixth sub-layers 322 and 330 each comprise 25 parts of the first dielectric material, and 75 parts of the second dielectric material. In FIG. 3, the third, fifth and seventh sub-layers 324, 328 and 332 each comprise 50 parts of each of the first dielectric material and the second dielectric material. In FIG. 3, the fourth and eighth sub-layers 326 and 334 each comprise 75 parts of the first dielectric material, and 25 parts of the second dielectric material. Finally, in FIG. 3 the uppermost layer comprises 100 parts of the first dielectric material, and zero parts of the second dielectric material.

The embodiment shown in FIG. 3 provides an example of a regularly varying concentration of the sub-layers from which the composite dielectric material layer is formed, which would result from varying both the first and the second rates of deposition in a substantially sinusoidal manner, and in which the first and second rates are out of phase with each other.

Referring now to FIG. 4, there is shown yet another embodiment of the composite dielectric material layer 410 in accordance with the present invention. The embodiment of the composite dielectric material layer 410 shown in FIG. 4 comprises five sub-layers 420, 422, 424, 426 and 428. Referring to the exemplary legend, the embodiment of FIG. 4 comprises a lowermost sub-layer 420 and an uppermost sub-layer 428, each comprising zero parts of the first dielectric material, and 100 parts of the second dielectric material. In FIG. 4, the next two sub-layers 422 and 426 (moving toward the center of the layer 410 in FIG. 4) each comprise 50 parts of the first dielectric material, and 50 parts of the second dielectric material. Finally, in FIG. 4, a center sub-layer 424 comprises 100 parts of the first dielectric material, and zero parts of the second dielectric material. In this embodiment, the sub-layer 424 is the thickest sub-layer.

Figure 5:
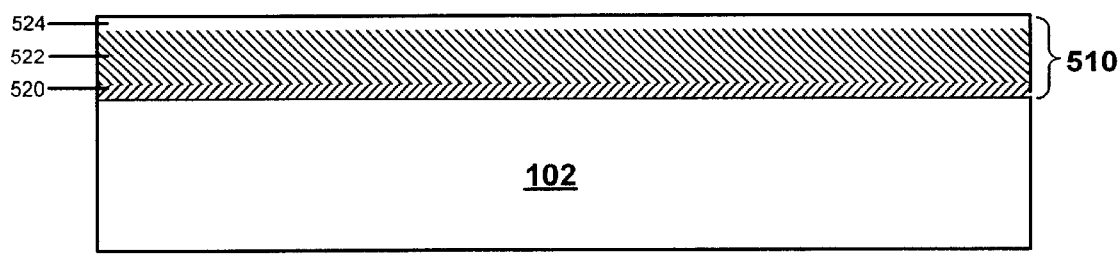

Referring now to FIG. 5, there is shown still another embodiment of the composite dielectric material layer 510 in accordance with the present invention. The embodiment of the composite dielectric material layer 510 shown in FIG. 5 comprises three sub-layers 520, 522 and 524. Referring to the exemplary legend, the embodiment of FIG. 5 comprises a lowermost sub-layer 520 comprising 25 parts of the first dielectric material, and 75 parts of the second dielectric material. In FIG. 5, the next sub-layer 522 (moving upward in the layer 510 in FIG. 5) comprises 75 parts of the first dielectric material, and 25 parts of the second dielectric material. Finally, in FIG. 5, an uppermost sub-layer 524 comprises 100 parts of the first dielectric material, and zero parts of the second dielectric material. In this embodiment, the sub-layer 522 is the thickest sub-layer. This embodiment provides an example of a non-regular varying of the first rate and the second rate, in which a non-symmetrical composite dielectric material layer 110 is formed.

Figure 6:
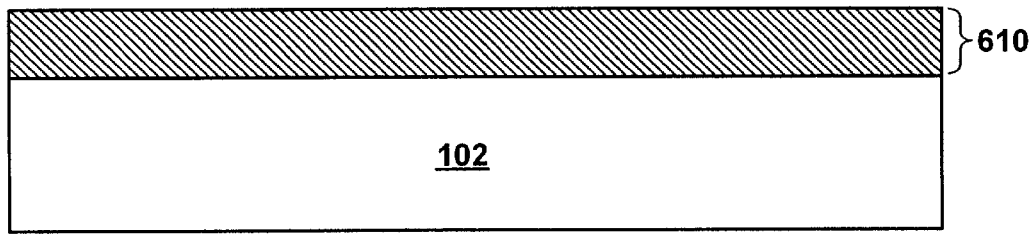

Referring now to FIG. 6, there is shown another embodiment of the composite dielectric material layer 610 in accordance with the present invention. The embodiment of the composite dielectric material layer 610 shown in FIG. 6 comprises a single, substantially uniform layer. Referring to the exemplary legend, the embodiment of FIG. 6 comprises a single layer comprising 75 parts of the first dielectric material, and 25 parts of the second dielectric material. The embodiment of FIG. 6 is an example of the composite dielectric layer which is formed when the first rate and the second rate are not varied during the step of depositing the composite dielectric material layer, and when the first rate is approximately three times the second rate.

The foregoing are but a few examples of the composite dielectric material layer in accordance with the present invention. The composite dielectric material layer could comprise any number of additional sub-layers. The number may range from 3 to at least about 10 sub-layers. As described more fully below, both the content of the dielectric materials and the relative thickness of these sub-layers may be selected and controlled as desired.

Although not described in detail for the sake of brevity, each sub-layer may comprise more than one dielectric material of either type, i.e., either high-K, mid-K or standard-K. Thus, within the scope of the invention is an embodiment comprising a sub-layer in which two or more high-K dielectric materials are combined in a single sub-layer, together with one or more standard-K dielectric materials. In addition, the first and second dielectric materials may both be standard-K dielectric materials or may both me high-K dielectric materials. A mid-K dielectric material may result from deposition of a standard-K dielectric material and a high-K dielectric material during the same deposition step to form the composite dielectric material layer.

In one embodiment, the standard-K dielectric material includes one or more of silicon dioxide, silicon nitride and silicon oxynitride. In one embodiment, the standard-K dielectric material includes aluminum oxide. In one embodiment, the standard-K dielectric material includes one or more of aluminum oxide, silicon dioxide, silicon oxynitride and silicon nitride. In one embodiment, the standard-K dielectric material is aluminum oxide. In one embodiment, the standard-K dielectric material comprises both aluminum oxide and silicon dioxide. In one embodiment, the standard-K dielectric material comprises both aluminum oxide and silicon nitride. In one embodiment, the standard-K dielectric material comprises both aluminum oxide and silicon oxynitride. In one embodiment, the standard-K dielectric material comprises both aluminum oxide and two or all three of silicon dioxide, silicon nitride and silicon oxynitride. In the foregoing embodiments, when the standard-K dielectric material comprises two or more dielectric materials, it is a composite dielectric material.

In one embodiment, the high-K dielectric material includes at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$). In addition to the foregoing high-K dielectrics, other high-K dielectric materials, for example, ferroelectric high-K dielectric materials such as lead lanthanum titanate, strontium bismuth tantalate, bismuth titanate and barium zirconium titanate may be suitably used in the present invention. Other high-K dielectric materials known in the art, including binary and ternary metal oxides having K values of about 20 or higher, are within the scope of the high-K materials disclosed herein, also may be used in the present invention.

As used herein the term "high-K derived metal" refers to a metal which was originally part of a high-K dielectric material. In the herein-described metal aluminates, the metal is a high-K derived metal and aluminum is not considered to be among the group of high-K derived metals. Similarly in the herein-described metal silicate dielectric materials and mixed metal aluminate/silicate dielectric materials, the metal is derived from the high-K dielectric material.

For example, in an embodiment in which the high-K dielectric material is hafnium oxide and the standard-K dielectric material is silicon dioxide, the composite dielectric material includes a silicate compound containing hafnium, silicon and oxygen Hf/Si/O. In one embodiment, the composite dielectric material comprises hafnium silicate, $HfSiO_4$, which is a mid-K dielectric material.

In an embodiment in which the high-K dielectric material contains a metal atom, e.g., in the form of a metal oxide, and the standard-K dielectric material is an aluminum oxide, the composite dielectric material comprises a metal-containing aluminate, where the metal is a high-K derived metal, as defined above. In an embodiment in which the high-K dielectric material is hafnium and the standard-K dielectric material contains both aluminum oxide and one or more of silicon dioxide, silicon oxynitride, or silicon nitride, the composite dielectric layer includes hafnium, aluminum, silicon, and either or both oxygen and/or nitrogen. These materials are mid-K dielectric materials.

Many examples of mid-K dielectric materials can be made. In one embodiment, the high-K dielectric material is zirconium oxide and the standard-K dielectric material is aluminum oxide, and the composite dielectric layer includes zirconium, aluminum and oxygen. In one such embodiment, the composite dielectric material comprises zirconium aluminate, $ZrAl_2O_5$. In yet another embodiment, the high-K dielectric material is cerium oxide and the standard-K dielectric material is aluminum oxide, and the composite dielectric layer includes cerium, aluminum and oxygen. In still another embodiment, the high-K dielectric material is tantalum oxide and the standard-K dielectric material comprises both aluminum oxide and silicon nitride, and the composite dielectric layer includes tantalum, aluminum, silicon, oxygen and nitrogen. As demonstrated by the foregoing embodiments, the composite dielectric material generally comprises a composite of the high-K dielectric material and the standard-K dielectric material. As in the above examples with hafnium, when one of the compounds of silicon, oxygen and nitrogen is included as a standard-K dielectric material with the aluminum oxide, the composite dielectric layer may also include silicon and nitrogen, in addition to the high-K derived metal, aluminum and oxygen.

In one embodiment, the high-K dielectric material is cerium oxide and the standard-K dielectric material is aluminum oxide, and the composite dielectric material layer includes cerium, aluminum and oxygen. In yet another embodiment, the high-K dielectric material is tantalum oxide and the standard-K dielectric material comprises both aluminum oxide and silicon nitride, and the composite dielectric material layer includes tantalum, aluminum, silicon, oxygen and nitrogen.

It should be recognized that since the sub-layers are formed of materials having a varying composition, the K-values of the sub-layers will differ from one another. As a result, the composite dielectric material layer will have a cross-sectional profile in which the K-value of the layer varies in the thickness or vertical direction. While the sub-layers have varying K-values, the composite dielectric material layer as a whole presents a single K-value which represents the weighted average of the sub-layers.

In one embodiment, the composite dielectric material layer has a K which can be estimated by finding the weighted average of the K's of the high-K dielectric material and the standard-K dielectric material. For example, a composite dielectric material layer having a K of about 17 would be obtained from an equal number of sub-layers of equal thickness of hafnium oxide, having a K of about 24, and aluminum oxide, having a K of about 10. In another example, a composite dielectric material layer having a K of about 15 would be obtained from an equal number of sub-layers of equal thickness of hafnium oxide, having a K of about 24, and a mixed aluminum oxide/silicon oxide, having a K of about 6. Thus, by selection of the material composition, number and thickness of layers, of both the high-K dielectric material and the standard-K dielectric material, selection and control of the K value of the composite dielectric material layer is possible.

The composite dielectric material layer, in one embodiment, is an amorphous material. In one embodiment, the composite dielectric material layer of the present invention, when formed from hafnium oxide, a usually crystalline material, and silicon dioxide, an amorphous material, has an amorphous structure. In most embodiments of the present invention, the composite dielectric material layer is amorphous. The layer may be amorphous as a result of the complex chemical structure of the composite dielectric material, which may not lend itself to a crystalline structure.

The sub-layers may be applied in content, thickness and numbers appropriate to the desired final, total thickness of the composite dielectric material layer. The thicknesses and numbers of the sub-layers may be selected to control the K value of the composite dielectric material.

Methods of Fabricating a Composite Dielectric Layer in a Semiconductor Device The present invention further relates to a method of fabricating the above-described semiconductor device. Thus, the present invention includes a method of fabricating a semiconductor device.

Figure 7:
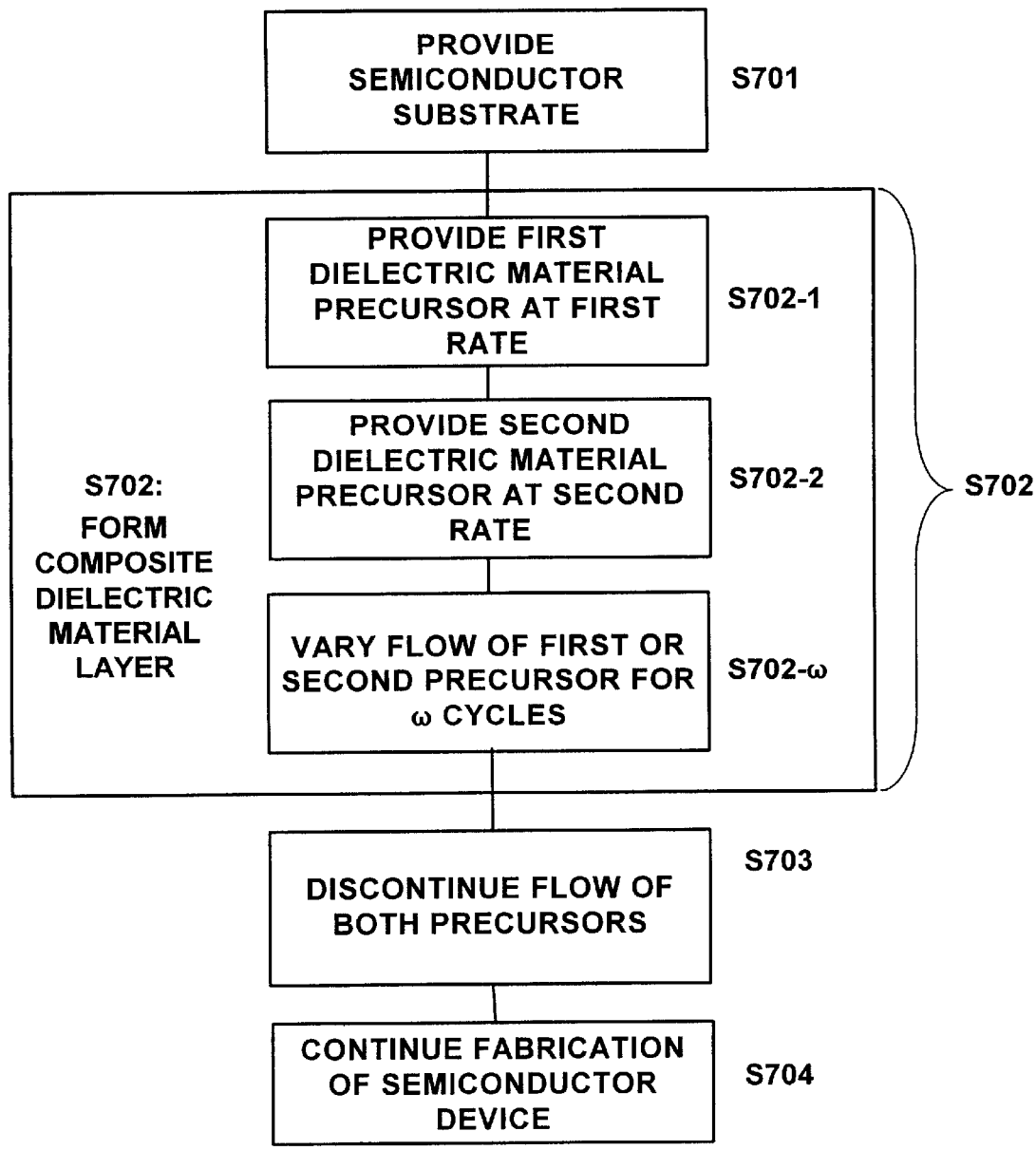
FIG. 7 is a schematic flow diagram showing the basic steps in a process of fabricating a semiconductor device in accordance with the present invention.

The method of fabricating a semiconductor device, in accordance with the present invention, is described in the following disclosure with reference to FIGS. 1–7. FIG. 7 is a flow diagram schematically presenting the steps of fabricating the semiconductor device of the present invention.

In the first step of the method of the present invention, shown in FIG. 7 as Step S701, a semiconductor substrate 102 is provided, as shown in, e.g., FIG. 2. The semiconductor substrate may be any appropriately selected semiconductor substrate known in the art, as described above.

In the second step of the method of the present invention, shown in FIG. 7 as Step S702, a series of alternating sub-layers of a first dielectric material and a second dielectric material are deposited on the semiconductor substrate 102 resulting in formation of the composite dielectric material layer 110, 210, 310, 410, 510 and 610, as shown in FIGS. 1–6. As shown in FIG. 7, the second step, S702, can be broken down into a series of $\omega$ sub-steps S702-1 . . . S702-$\omega$, in which a series of sub-layers 110a . . . 110$\omega$ (using the reference numeral 110 from the embodiment of the composite dielectric material layer 110 of FIG. 1 as example) are deposited.

In one embodiment, either or both of the first dielectric material and the second dielectric material may be deposited by chemical vapor deposition (CVD). The CVD method may be any appropriate CVD method known in the art. For example, the CVD method may be ALD (ALCVD), PECVD, RTCVD, PLD, MLD or MOCVD. In one embodiment, both the first dielectric material and the second dielectric material are deposited in the same apparatus. In another embodiment, both dielectric materials are deposited in the same apparatus, and these materials are deposited sequentially by controlling the supply of precursor materials to the CVD apparatus.

In the method of the present invention, rather than applying the sub-layers in discrete steps, the sub-layers are depositing on a continuous basis. In one embodiment, the first dielectric material and the second dielectric material are deposited simultaneously through at least part of the deposition step. In one embodiment, the deposition step includes deposition of only one of the first or second dielectric material during some part of the deposition step. In one embodiment, during substantially all of the deposition step, both the first and second dielectric materials are deposited simultaneously, although possibly at different and varying rates.

In one embodiment, the first dielectric material is deposited at a first rate, and the second dielectric material is deposited at a second rate. In one embodiment, the first rate and the second rate remain substantially constant throughout the deposition step. In another embodiment, the first rate and the second rate vary with respect to each other, either by varying one of the two rates, or by varying both rates. In one embodiment, at least one the first rate and the second rate is varied in a regularly varying manner. A regularly varying manner means that, when the rate of deposition is plotted against time, the graph includes a regular variation in deposition, such as a regularly repeating square waveform, triangular waveform, sinusoidal waveform or some other form.

In one such embodiment, at least one of the two rates is varied in a substantially sinusoidal manner. In one such embodiment, both the first and the second rates are varied in a substantially sinusoidal manner, and in one embodiment, the two substantially sinusoidally varying rates are out of phase with each other, and in one embodiment, the substantially sinusoidally varying rates are about 180° out of phase with each other. Other relationships may exist between the varying rates of deposition of the layers, and combinations of the variations may be used. For example, rather than gradually varying the rates, at least one of the rates may be varied in a square wave manner, i.e., substantially in an on/off mode, with little or no variation between the "on" state and the "off" state. As another example, at least one of the rates may be varied in a stepwise manner, so that the change from "off" to "full-on" (i.e., the maximum rate used in that step) varied in substantially discrete steps.

In one embodiment, the rate of deposition of each dielectric material used to fabricate the composite dielectric material layer is controlled and varied by controlling the rate at which one or more precursor materials for the respective dielectric materials is provided to the apparatus in which the deposition step is conducted. Thus, for example, when one of the first dielectric material or the second dielectric material is silicon dioxide, the rate at which a precursor for silicon dioxide is provided to a CVD apparatus controls the rate at which the silicon dioxide is deposited. The precursor for silicon dioxide may be, for example, silane ($SiH_4$), TEOS (tetraethylorthosilicate), dichlorosilane ($SiH_2Cl_2$) or tetrachlorosilane ($SiCl_4$). In addition, of course, a co-reactant, such as oxygen or nitrous oxide, must also be provided for deposition of silicon dioxide from these sources. Normally, the rate controlling precursor is the silicon precursor, and the co-reactant is provided in excess, or non-limiting quantities. Thus, the oxidant, such as oxygen or nitrous oxide, may be provided at a stoichiometric rate or at an excess, throughout the deposition, to react with the dielectric material precursors being provided to the deposition apparatus.

Similarly, the rate at which a high-K dielectric material is deposited may be controlled and varied by controlling and varying the rate at which a precursor therefor is provided to the deposition apparatus. Thus, for example, in an embodiment in which hafnium oxide is deposited as the first or second dielectric material, the hafnium precursor may be supplied as a hafnium-containing vapor or gas such as hafnium tetra-t-butoxide. The rate at which the hafnium precursor is provided to a CVD apparatus may be used to control the rate at which the hafnium oxide is deposited. As with the silicon, a co-reactant, such as oxygen or nitrous oxide, is also provided for deposition of hafnium oxide, and the rate controlling precursor is normally the hafnium precursor, and the co-reactant is provided in excess, or non-limiting quantities.

In the following, an example of the step of depositing on a semiconductor substrate a composite dielectric material layer, comprising $SiO_2$ and $HfO_2$ as the at least two dielectric materials, is provided. In this example, the first sub-layer applied is the $SiO_2$. This example is for illustration purposes and is not intended to limit the scope of the disclosure in any way. Such limitation is only as contained in the claims appended hereto.

The process begins by providing a semiconductor substrate and placing it in an appropriate deposition apparatus. As noted above, in one embodiment, a CVD apparatus is employed. When the appropriate deposition conditions have been established, a supply of silicon-containing starting material or precursor is provided, together with a source of oxygen, such as oxygen gas, nitrous oxide gas, or air. The silicon-containing precursor provided may be, for example, a silicon containing gas, such as silane, $SiH_4$.

At a selected time after a quantity of $SiO_2$ has been deposited, the flow of a hafnium-containing precursor is provided to the deposition apparatus. The point at which the hafnium precursor flow is started depends on the quantity or thickness of unmixed $SiO_2$ desired and on the quantity and thickness of the composite dielectric material desired to be formed. The thickness of the $SiO_2$ when the hafnium precursor is started can range from zero to a thickness from about 5 Å to about 50 Å.

As noted above, the hafnium precursor may be provided together with the silicon precursor or the silicon precursor may be reduced and/or discontinued when the hafnium precursor is started. The hafnium precursor may be any suitable, known material which can be provided to a CVD apparatus for deposition of $HfO_2$.

When a suitable quantity or thickness of hafnium oxide has been deposited, the flow of the hafnium-containing precursor is reduced, and the flow of silane gas is continued, increased or restored to the CVD apparatus, as appropriate. The flow of oxygen gas or other oxygen source, is continued at a stoichiometrically appropriate level throughout the step of depositing the composite dielectric material layer.

The deposition of each of the precursor materials is continued in the selected manner until a suitably selected number of sub-layers and thickness of a composite dielectric material layer has been deposited. When a suitable composite dielectric material layer has been deposited, the flow of the precursors are stopped, as shown in Step S703 in FIG. 7.

The sub-steps S702-1 to S702-ω of the Step S702 are repeated and continued until a selected number ω of sub-layers 110ω (or 210ω, 310ω, 410ω, etc) has been deposited to form a composite dielectric material layer 110, 210, 310, 410, 510 or 610 as appropriate.

In the embodiment illustrated in FIG. 1, sub-steps S702-1 through S702-7 have been carried out, to deposit the composite dielectric material layer 110 having a total of seven sub-layers 120, 122, 124, 126, 128, 130 and 132 (ω=7).

In the embodiment illustrated in FIG. 2, sub-steps S702-1 through S702-5 have been carried out, to deposit the composite dielectric material layer 210 having a total of five sub-layers 220, 222, 224, 226 and 228 (ω=5).

In the embodiment illustrated in FIG. 3, sub-steps S702-1 through S702-9 have been carried out, to deposit the composite dielectric material layer 410 having a total of nine sub-layers 320, 322, 324, 326, 328, 330, 332, 334 and 336 (ω32 9).

In the embodiment illustrated in FIG. 4, sub-steps S702-1 through S702-5 have been carried out, to deposit the composite dielectric material layer 410 having a total of five sub-layers 420, 422, 424, 426 and 428 (ω=5).

In the embodiment illustrated in FIG. 5, sub-steps S702-1 through S702-3 have been carried out, to deposit the composite dielectric material layer 510 having a total of three sub-layers 520, 522 and 524 (ω=3).

In the embodiment illustrated in FIG. 6, sub-steps S702-1 and S702-2 have been carried out simultaneously, to deposit the composite dielectric material layer 610 having a single sub-layer 610.

As shown in FIGS. 1–6, deposition of the sub-layers a-ω forms a composite dielectric material layer having the indicated number of sub-layers.

Following Step S703, in which provision of all precursor materials to the deposition apparatus is terminated, fabrication of the semiconductor device is continued as shown in Step S704, in FIG. 7.

In one embodiment, Step S703 includes annealing the composite dielectric material layer at a high temperature. In general, however, one of the benefits of the present invention is that such annealing may not be needed, since the at least two dielectric materials are laid down simultaneously. When used, the annealing may be any type of annealing or thermal treatment such as a post deposition annealing, RTA, or thermal heating applied by or during a subsequent deposition step. In such an embodiment, the annealing at a high temperature need not immediately follow the preceding steps of the method of the present invention, and other production steps may intervene between these steps, within the scope of the invention. In another embodiment, the step of annealing at a high temperature follows substantially immediately the preceding steps of the method, not including any routine handling and preparatory steps which may be needed. In one embodiment, the step of annealing at a high temperature takes place in the same apparatus in which the composite dielectric material layer is deposited.

The annealing step may be carried out at a temperature in the range from about 700° C. to about 1150° C. In one embodiment, the annealing temperature is in the range from about 950° C. to about 1100° C., and in another it is about 1000° C. to about 1050° C. In one embodiment, the annealing step is applied as an RTA technique, in which annealing is performed in $O_2$, NO, $N_2O$ or $N_2$ or mixtures thereof, for a few seconds to a few minutes. The annealing time should be sufficient to form the composite dielectric layer, as described herein. In one embodiment, the annealing time is sufficient to form a composite dielectric material which is a composite of the high-K dielectric material and the standard-k dielectric material.

In general, the annealing step may be carried out by any method and under any conditions suitable for the materials, and which will obtain the results desired from the annealing step, as will be understood by those skilled in the art.

As described above, the composite dielectric material represents a composite of the high-K dielectric material and the standard-K dielectric material As will be recognized by those of skill in the art, each sub-layer 110a–110ω is quite thin. In one embodiment, there are no distinctly separated sub-layers. In one embodiment, as shown for example in FIG. 6, there is a composite dielectric material layer 610 comprising a single sub-layer. In an embodiment such as that shown in FIG. 6, the single layer may have a thickness in the range from about 20 Å to about 200 Å. In one embodiment, the thickness of each sub-layer is in the range from about 5 Å to about 50 Å. It may be difficult to discern whether a given composite dielectric layer contains sub-layers. The thicknesses of the sub-layers are so small that it may not be possible to determine with certainty whether or to what extent discrete sub-layers remain. Suitable analytical equipment may discern the identity of the dielectric material at various levels of the composite dielectric layer.

While the invention has been described in conjunction with specific embodiments herein, it is evident that many alternatives, modifications and variations will be apparent to those skilled in the art in light of the foregoing description. Accordingly it is intended to embrace all such alternatives and modifications in variations as for within the spirit and broad scope of the appended claims.

What is claimed is:

1. A method of fabricating a semiconductor device, comprising:

providing a semiconductor substrate;

depositing on the semiconductor substrate a composite dielectric material layer comprising elements of at least two dielectric materials, wherein the step of depositing comprises providing a first precursor for a first dielectric material at a first rate and providing a second precursor for a second dielectric material at a second rate, wherein at least a portion of the at least two dielectric materials are deposited simultaneously, and wherein at least one of the first rate and the second rate is varied during the step of depositing, whereby the composite dielectric material layer comprises a concentration gradient of the first dielectric material relative to the second dielectric material in a thickness direction of the composite dielectric material layer.

2. The method of claim 1, wherein at least one of the first dielectric material and the second dielectric material comprises a high-K dielectric material.

3. The method of claim 2, wherein the high-K dielectric material comprises at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$).

4. The method of claim 2, wherein at least one of the first dielectric material and the second dielectric material comprises a standard-K dielectric material.

5. The method of claim 4, wherein the standard-K dielectric material comprises one or more of silicon dioxide, silicon oxynitride, silicon nitride, silicon-rich silicon nitride and aluminum oxide.

6. The method of claim 1, wherein the at least one rate is varied in a substantially sinusoidal manner.

7. The method of claim 1, wherein both rates are varied in a substantially sinusoidal manner.

8. The method of claim 7, wherein the rates are out of phase.

9. The method of claim 1, wherein the composite dielectric layer comprises a metal silicate, a metal aluminate, or a mixture of a metal silicate and a metal aluminate formed from elements of the first dielectric material and the second dielectric material.

10. The method of claim 1, wherein both the first rate and the second rate are varied.

11. The method of claim 1, wherein the step of depositing is carried out by CVD.

12. A method of fabricating a semiconductor device, comprising:

providing a semiconductor substrate; and depositing by CVD over the semiconductor substrate a composite dielectric material layer comprising elements of at least one high-K dielectric material and at least one standard-K dielectric material, wherein the step of depositing comprises providing a high-K precursor at a first rate and a standard-K precursor at a second rate and varying at least one of the first rate or the second rate, wherein at least a portion of the at least two dielectric materials are deposited simultaneously, whereby the composite dielectric material layer comprises a concentration gradient of the first dielectric material relative to the second dielectric material in a thickness direction of the composite dielectric material layer.

13. The method of claim 12, wherein the high-K dielectric material comprises at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$).

14. The method of claim 12, wherein the standard-K dielectric material comprises one or more of silicon dioxide, silicon oxynitride, silicon nitride, silicon-rich silicon nitride and aluminum oxide.

15. The method of claim 12, wherein the at least one rate is varied in a substantially sinusoidal manner.

16. The method of claim 12, wherein both rates are varied in a substantially sinusoidal manner.

17. The method of claim 16, wherein the rates are out of phase.

18. The method of claim 12, wherein the composite dielectric layer comprises a metal silicate, a metal aluminate or a mixture of a metal silicate and a metal aluminate, formed from elements of the first dielectric material and the second dielectric material.

19. A method of fabricating a semiconductor device, comprising:

providing a semiconductor substrate; and depositing by CVD over the semiconductor substrate a composite dielectric material layer comprising elements of at least one high-K dielectric material and at least one standard-K dielectric material, and having a concentration gradient of the first dielectric material relative to the second dielectric material in a thickness direction of the composite dielectric material layer, wherein the high-K dielectric material comprises at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$) and PST ($PbSc_xTa_{1-x}O_3$), the standard-K dielectric material comprises one or more of silicon dioxide, silicon oxynitride, silicon nitride, silicon-rich silicon nitride and aluminum oxide, the step of depositing comprises providing a high-K precursor at a first rate and a standard-K precursor at a second rate and varying at least one of the first rate or the second rate and depositing simultaneously at least a portion of the at least two dielectric materials, and the composite dielectric material layer comprises a metal silicate, a metal aluminate or a mixture of a metal silicate and a metal aluminate.

* * * * *